United States Patent [19]

Chappell et al.

[11] Patent Number: 4,843,261

[45] Date of Patent: Jun. 27, 1989

[54] COMPLEMENTARY OUTPUT, HIGH-DENSITY CMOS DECODER/DRIVER CIRCUIT FOR SEMICONDUCTOR MEMORIES

[75] Inventors: Barbara A. Chappell; Terry I. Chappell, both of Amawalk; Stanley E. Schuster, Granite Springs, all of N.Y.

[73] Assignee: International Business Machines Corporation, Armonk, N.Y.

[21] Appl. No.: 161,813

[22] Filed: Feb. 29, 1988

[51] Int. Cl.$^4$ ........................................... H03K 19/096
[52] U.S. Cl. .................................. 307/449; 307/443; 307/452; 307/463; 307/481; 365/230.06
[58] Field of Search ................ 307/443, 452, 448–449, 307/463, 481; 365/230, 233

[56] References Cited

U.S. PATENT DOCUMENTS

| | | | |
|---|---|---|---|
| 4,194,130 | 3/1980 | Moench | 307/463 |
| 4,308,526 | 12/1981 | Smith | 307/449 X |
| 4,309,629 | 1/1982 | Kamuro | 307/449 |
| 4,471,240 | 9/1984 | Novosel | 307/463 |
| 4,514,829 | 4/1985 | Chao | 307/449 X |
| 4,584,674 | 4/1986 | Watanabe | 365/230 |
| 4,618,784 | 10/1986 | Chappell et al. | 365/230 X |
| 4,635,233 | 1/1987 | Matsumoto et al. | 365/230 |
| 4,725,742 | 2/1988 | Tachimori et al. | 307/443 X |

OTHER PUBLICATIONS

"Improved Decode Circuits for CMOS Memory Arrays", IBM T.D.B., vol. 30, No. 2, Jul. 1987, pp. 664–666.

Primary Examiner—David Hudspeth
Attorney, Agent, or Firm—John J. Goodwin

[57] ABSTRACT

A high performance decoder/driver circuit for a semiconductor memory having A1 to AN (true) and A1 to $\overline{AN}$ (complement) address lines for receiving A1 to AN address bit signals thereon from internal address buffers. A $\phi$PC line is included for receiving a $\phi$PC precharge clock signal thereon and a $\phi$R line is provided for receiving a $\phi$R reset clock signal thereon. The decoder/driver circuit includes an OR decoder means having a plurality of transistor switching devices connected to A1 to AN-1 or A1 to AN-1 of the true and complement address lines for the AN to AN-1 address bits for producing a high or low level signal on an OR decoder output node depending on the address bits state. The decoder/driver circuit further includes a selection means having a plurality of transistor devices including p-channel devices, having diffusion contacts connected to the output node of the decoder and to AN and $\overline{AN}$ lines to produce a first selection signal when the OR decoder output node is low and the AN line is high and a second selection signal when the OR decoder output node is low and the $\overline{AN}$ line is high. A driver circuit is connected to the selection means and is responsive to the first selection signal to provide an output signal on a first memory word line and is further responsive to the second selection signal to provide an output signal on a second memory word line.

12 Claims, 3 Drawing Sheets

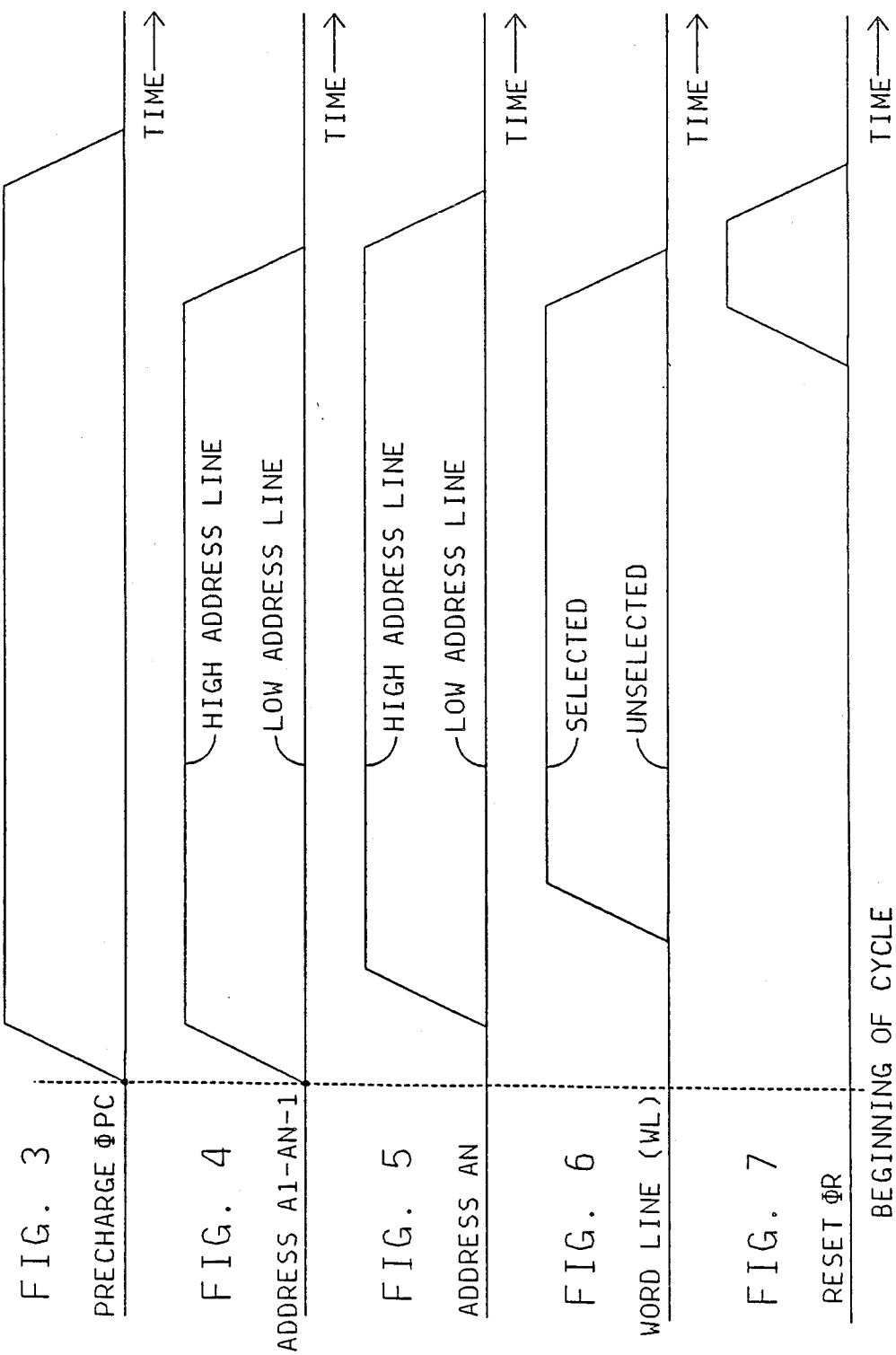

COMPLEMENTARY OUTPUT, HIGH-DENSITY CMOS DECODER/DRIVER CIRCUIT FOR SEMICONDUCTOR MEMORIES

BACKGROUND OF THE INVENTION

1. Field of the Invention

The present invention relates to decoder/driver circuits for semiconductor memories, and more particularly to a NOR/NAND two-stage circuit that can be used as a word line decoder/driver in a CMOS random access memory.

2. Description of the Prior Art

In U.S. Pat. No. 4,063,118 issued Dec. 13, 1977 to Nishimura, entitled MIS DECODER PROVIDING NON-FLOATING OUTPUTS WITH SHORT ACCESS TIME describes a structure where, in a multiplicity of NAND decoders, each comprises a dynamic ratioless circuit including a capacitor to be charged in response to a precharge pulse, an MOS logic circuit for discharging the capacitor by an address pulse in the non-selection mode, and first and second MOSFETs connected in series between a clock pulse terminal and ground. The MOSFET conducts in response to the terminal voltage of the capacitor to transmit a clock pulse from its drain and supplies an output to a word line. The terminal voltage of the capacitor in one decoder is applied to the gate of the second MOSFET of another decoder and the word line output of the other decoder is grounded even during the discharging period of the capacitor in the non-selection mode of the other decoder, enabling a synchronous supply of the address and the clock pulses.

In U.S. Pat. No. 4,344,005 issued Aug. 10, 1982 to Stewart, entitled POWER GATED DECODING describes a decoder in which the decoding of N input variables to produce $2^N$ unique outputs is carried out in steps, and in which some of the signals to be decoded also function to power part of the decoding circuitry. First, X of the N variables are decoded separately, as a group, to produce $2^X$ unique outputs while the remaining N-X variables are also separately decoded, as a group to produce $2^{(N-X)}$ unique outputs, where N and X are positive integers and X is less than N. Then, the outputs of the two groups are logically combined by means of $2^N$ decoding buffer gates to produce $2^N$ unique outputs. Each one of the $2^X$ unique outputs is applied to the signal input terminals of $2^{(N-X)}$ different ones of the $2^N$ buffer gates and each one of the $2^{(N-X)}$ unique outputs is used to power $2^X$ different ones of the $2^N$ buffer gates to produce $2^N$ unique outputs of the N input variables, at the outputs of the buffer gates.

U.S. Pat. No. 4,514,829 issued Apr. 30, 1985 to Chao, entitled WORD LINE DECODER AND DRIVER CIRCUITS FOR HIGH DENSITY SEMICONDUCTOR MEMORY describes word line CMOS decoder and driver circuits for semiconductor memories wherein the pitch of the decoder is twice that of the word line, the number of decoders required is reduced by a half, and the word line selection pulse can be applied prior to word line selection. The decoder and driver circuits include a transistor clock load device having its gate electrode driven by a decoder clock pulse or address pulse and a plurality of decoder address switch devices having their gate electrodes driven, respectively, by a plurality of address signals. The clock load device and the address switch devices are connected to a common node at the input to an inverter stage.

U.S. Pat. No. 4,618,784 issued Oct. 21, 1986 to Chappell et al, entitled HIGH-PERFORMANCE, HIGH-DENSITY CMOS DECODER/DRIVER CIRCUIT, describes a decoder/driver circuit for a semiconductor memory having A1 to AN (true) and A1 to $\overline{\text{AN}}$ (complement) address lines for receiving A1 to AN address bit signals thereon from internal address buffers. The decoder/driver circuit includes a NOR decoder means having a plurality of transistor switching devices connected to A1 to AN-1 or A1 to AN-1 of the true and complement address lines for the AN to AN-1 address bits for producing a high or low level signal on a decoder output node depending on the address bits state. The decoder/driver circuit further includes a selection means having a plurality of transistor devices connected to the output node of the decoder to produce a first selection signal when the decoder output node and the AN line is high and a second selection signal when the decoder output node and the $\overline{\text{AN}}$ line is high. A driver circuit is connected to the selection means and is responsive to the output signal of the NOR decoder circuit and the first selection signal to provide an output signal on a first memory word line and is further responsive to the output signal of the NOR decoder circuit and the second selection signal to provide an output signal on a second memory word line.

A variety of decoder circuits for semiconductor memories are available in the art.

In U.S. Pat. No. 4,309,629 issued Jan. 5, 1982 to Kamuro, entitled MOS TRANSISTOR DECODER CIRCUIT, an MOS transistor decoder circuit is disclosed including a plurality of MOS transistors and at least one load element. At least one additional MOS transistor connected to the plurality of MOS transistors and the load element for selecting either of two output terminals for the plurality of MOS transistors, through which decoded output signals are developed. The two additional MOS transistors connected to the two output terminals have normal and complement bit signals, respectively.

In U.S. Pat. No. 4,264,828 issued Apr. 28, 1981 to Perlegos et al, entitled MOS STATIC DECODING CIRCUIT, a metal-oxide-semiconductor static decoding circuit for selecting an addressed line in a high density memory array, or the like, is disclosed. The circuit is laid-out along array lines where the lines have a given pitch. Three levels of decoding are employed. The highest level permits the pulling-up of a common node in the second level decoder. The third level of decoding selects one of a plurality of array lines coupled to this node. Zero threshold voltage MOS devices are employed for coupling the first and third decoders to the second decoder.

In U.S. Pat. No. 4,259,731 issued Mar. 31, 1981 to Moench, entitled QUIET ROW SELECTION CIRCUITRY, there is provided a quiet row select circuit for holding unselected word lines or row select lines in a memory array at a predetermined voltage potential. Transistors are used to couple each row select line to the predetermined voltage potential. The adjacent row select lines of at least one of the adjacent select lines is always coupled to the predetermined voltage when in an unselected state. A transistor is also used to couple each of the adjacent row select lines together and this transistor is enabled whenever the adjacent row select lines are non-selected so that both row select lines are coupled together to the predetermined voltage level.

In another reference of Moench, U.S. Pat. No. 4,200,917 issued Apr. 29, 1980, entitled QUIET COLUMN DECODER, a decoder is provided for semiconductor memory systems which prevents glitches from being coupled into the silicon substrate during the period of time that the sense amplifiers are sensing data on the bit sense lines. The quiet column decoder has double clock NOR gates which allows the address lines to be continuous non-multiplexed lines. The double clocked NOR gate has two transistors for precharging a first and a second node within the NOR gate. Another transistor is coupled between the second node and a voltage reference terminal to serve as an enabling device for the NOR gate. The first node of the NOR gate serves as an output for the column decoder.

In U.S. Pat. No. 4,429,374 issued Jan. 31, 1984 to Tanimura, entitled MEMORY ARRAY ADDRESSING, an address decoder for one memory axis is disclosed which comprises NAND circuits while the address decoder for the other axis comprises NOR circuits. A semiconductor memory circuit device comprises at least first and second decoder circuits. The first decoder circuit is so constructed as to receive at least partial address signals among address signals of a plurality of bits and to provide decoded signals of the partial address signals as intermediate signals. The second decoder circuit is so constructed as to receive the intermediate signals, to thereby provide signals for selecting from among a plurality of memory circuits a memory circuit determined by the address signals of the plurality of bits.

A publication entitled "CMOS Decoder Circuit" by L. M. Terman, at page 2135 of Vol. 25, No. 4 Sept. 1982 of the IBM Technical Disclosure Bulletin relates to improvements in CMOS decoder circuits, and particularly to a decoder circuit which does not dissipate DC power. The decoder is followed with two branches with CMOS drivers for word lines.

In Vol. 18, No. 12, May 1976 of the IBM Technical Disclosure Bulletin, G. H. Parikh in a publication entitled "High Speed FET Decoder" on page 3955 describes a field-effect transistor decoder circuit which allows improved speed of decoding FET random-access memories, by reducing the capacitance required to be discharged in an unselected decoder.

The speed is further increased by reducing the capacitance of the nodes to be discharged wherein isolation transistor devices are provided to isolate the capacitance on word line voltage nodes to allow bootstrapping to occur if a node has not been discharged.

Other related prior art includes the following references:

U.S. Pat. No. 4,194,130 to Moench issued Mar. 18, 1980, entitled DIGITAL PREDECODING SYSTEM;

U.S Pat. No. 4,433,257 to Kinoshita issued Feb. 21, 1984, entitled VOLTAGE SUPPLY FOR OPERATING A PLURALITY OF CHANGING TRANSISTORS IN A MANNER WHICH REDUCES MINORITY CARRIER DISRUPTION OF ADJACENT MEMORY CELLS;

U.S. Pat. No. 4,156,938 to Proebsting et al issued May 29, 1979, entitled MOSFET MEMORY CHIP WITH SINGLE DECODER AND BI-LEVEL INTERCONNECT LINES.

SUMMARY OF THE INVENTION

An object of the present invention is to provide a high-performance decoder/driver circuit that can be used as a word line decoder/driver in high performance CMOS RAMs.

A further object of the present invention is to provide a memory decoder/driver circuit that includes a OR-/AND two-stage CMOS decoder and driver circuit wherein an address bit signal and its complement signal supply VDD to diffusion contacts on p-channel devices in the AND stage in order to reduce capacitance.

Still another object of the present invention is to provide a decoder/driver circuit characterized in including bit signals from an amplifier which are delayed by inverting the amplifier output and, wherein said bit signals are applied to device diffusion contacts.

These and other objects, features and advantages of the invention will be more apparent from the following more particular description of the preferred embodiments as illustrated in the accompanying drawings.

BRIEF DESCRIPTION OF THE DRAWINGS

FIGS. 3, 4, 5, 6 and 7 are illustrations of waveforms of signals at various points in the circuit shown in FIG. 1.

DESCRIPTION OF THE PREFERRED EMBODIMENTS

Figure 1:
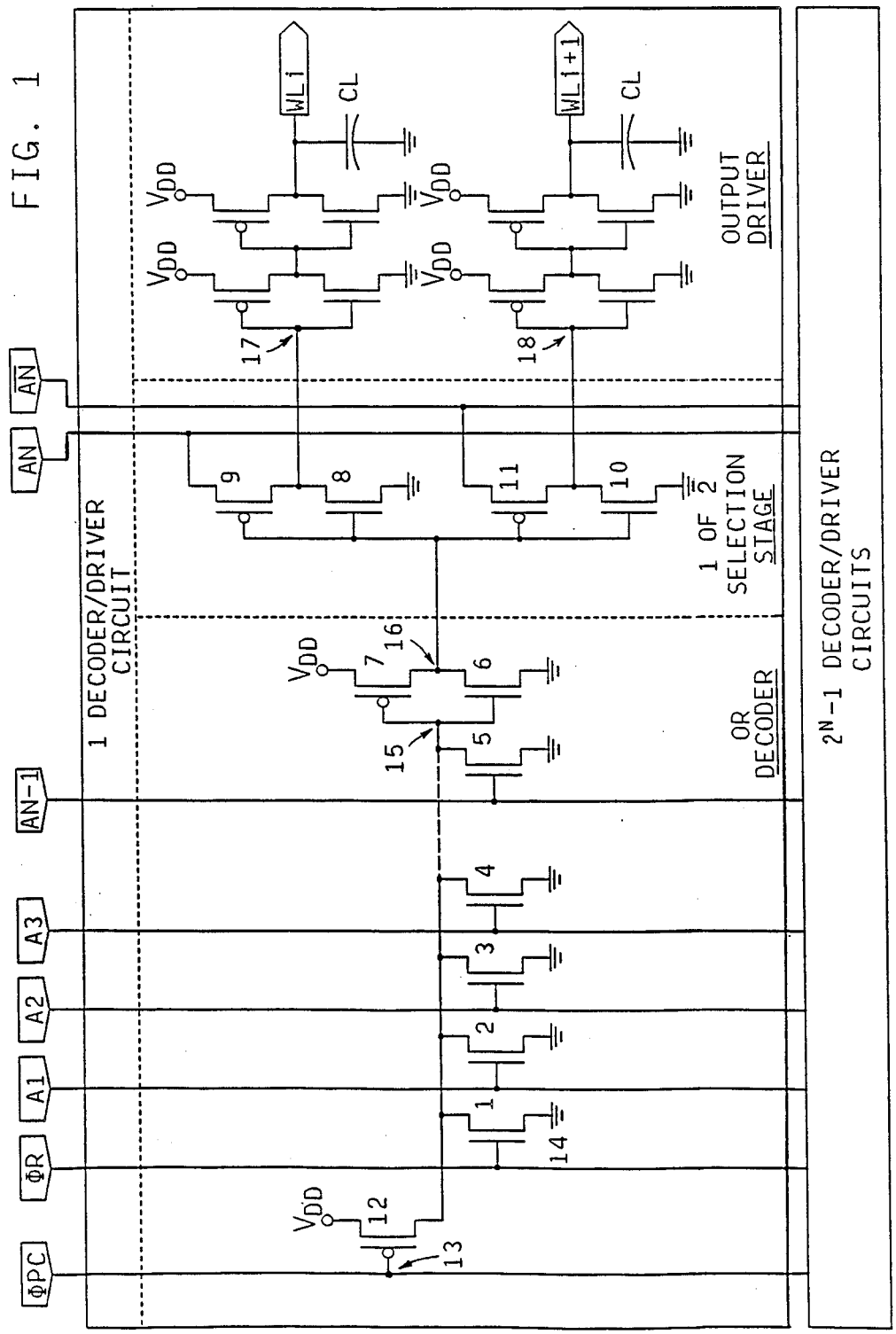
FIG. 1 is a schematic diagram of $2^N$ decoder/driver circuits according to the principles of the present invention.

A schematic diagram of $2^N$ decoder/driver circuits is shown in FIG. 1. Signal $\phi PC$ applied on gate lead 13 of p-channel device 12 is a precharge clock signal and signal $\phi R$ applied on gate lead 14 of n-channel device 1 is a reset clock signal. In FIG. 1, a MOSFET device having a circle on the gate lead, as shown in device 12, is a p-channel device whereas a MOSFET without a circle on the gate lead, as shown in device 1, is an n-channel device. Devices 1,2,3,4 . . . 5,6,7 are connected in a conventional OR decoder circuit configuration, well known to those skilled in the art. Lines A1 through AN are internal address lines from the address buffers, shown in FIG. 2, and the first A1-AN-1 address lines are connected to the inputs of the OR decoder circuit in the conventional manner. That is, the gate of each device in the OR decoder circuit is connected to either the true or complement address line for the corresponding address bit from the address decoders with the circuit drawn in FIG. 1 showing the details of just one of the $2^N$ OR decoders, each of which is selected (low output) by a different unique address while the remainder of the OR decoders will be unselected (high output). The true and complement lines for address bit AN are both connected to the decoder/driver circuit in the 1 of 2 selection stage, and are shown explicitly in FIG. 1. The 1 of 2 selection stage output is the input to the output driver stage.

Figure 2:
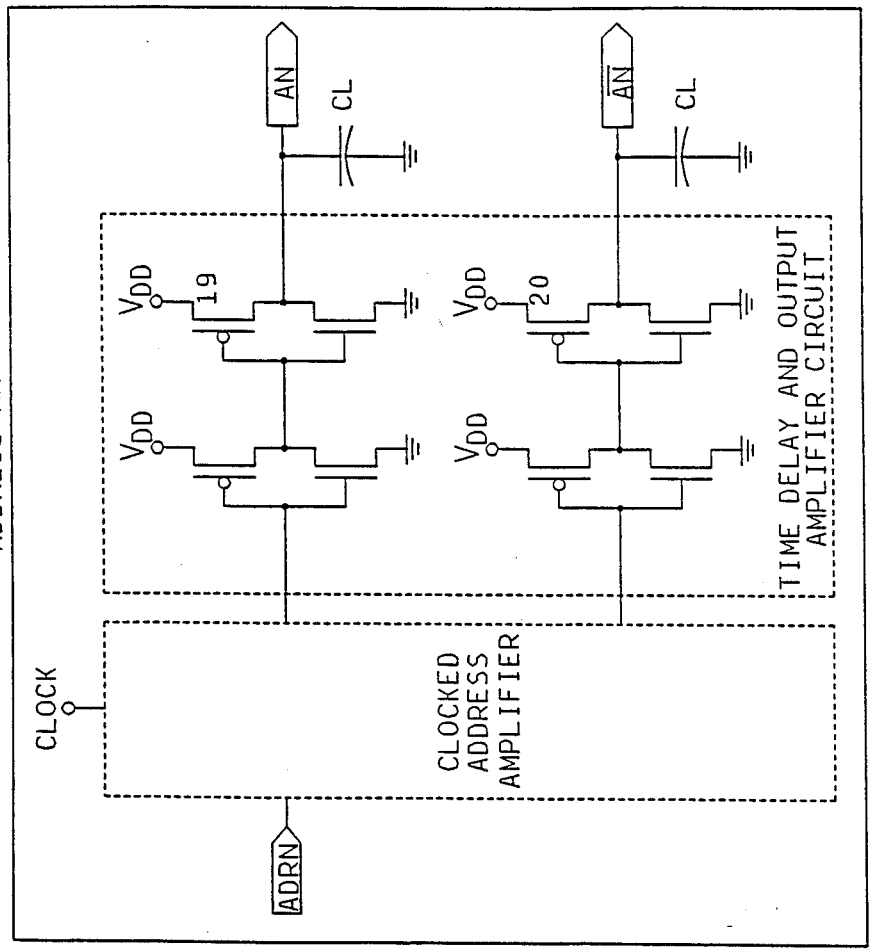
FIG. 2 is a schematic diagram of N address buffer circuits according to the principles of the present invention.
Figure 2:
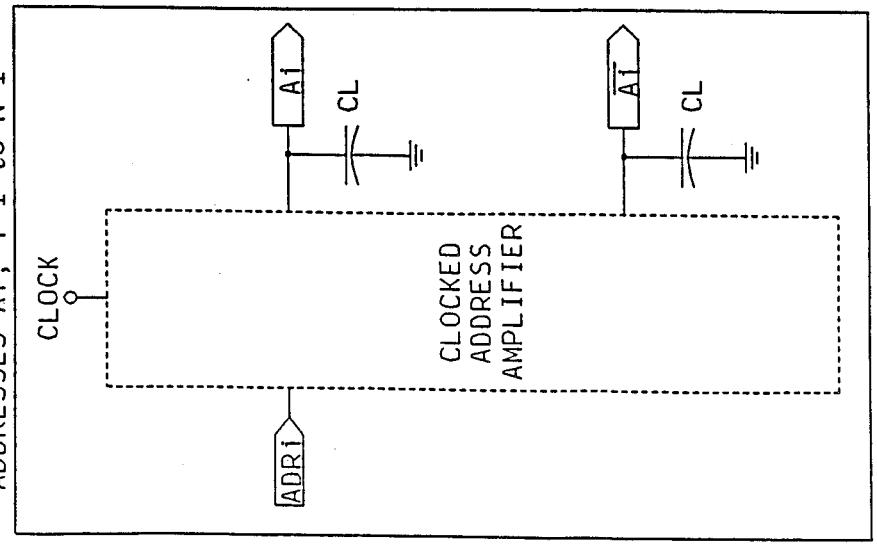

The functional operation of the proposed circuit will now b described. At the start of a cycle, the address lines A1, $\overline{A1}$, A2, $\overline{A2}$, . . . AN, $\overline{AN}$ are low as shown in FIGS. 4 and 5. The precharge signal $\phi PC$ applied to the gate of p-channel device 12 on line 13 is low as shown in FIG. 3 and reset signal $\phi R$ applied to line 14 is also low as shown in FIG. 7. Node 16 is low and nodes 17 and 18 were discharged low when reset clock signal φR on line 14 went high at the end of the previous cycle. At the beginning of the cycle, precharge clock signal φPC goes high (see FIG. 3) turning transistor 12 (T1) off. It is assumed for purposes of explanation that driver output WLi+1 is to be selected. For this case, address lines A1,A2 ... AN remain low and $\overline{A1},\overline{A2}...\overline{AN}$ go high. Since all inputs to the OR remain low, node 16 remains low. Now as soon as signal $\overline{AN}$ goes high, the node 18 is charged to VDD through transistors 11 and 20 (FIG. 2). As a result, the driver output WLi+1 is selected and goes high. All other driver outputs including WLi remain low and thus are deselected. If, on the other hand, signal $\overline{AN}$ remains low and signal AN goes high, then node 17 is charged to VDD through transistors 9 and 19 (FIG. 2), selecting driver output WLi; all other driver outputs remain deselected. If any one of the address inputs A1 through AN-1 goes high, node 16 of the OR circuit will be charged to VDD, turning off devices 9 and 11 and preventing the charging of nodes 17 and 18, keeping both word lines WLi and WLi+1 low or deselected regardless of whether AN or $\overline{AN}$ goes high. Thus, $2^N-1$ OR circuits will have a node 16 that goes high and only one of the $2^N$ OR circuits will have a node 16 that is low, allowing a selected word line to rise when either AN or $\overline{AN}$ goes high.

The decoding function of the circuit is summarized in Table 1, where the state of the OR decoder node 16 will be low in precharge and remain low if the OR is selected; it goes high if the OR decoder is deselected. If the OR is deselected (node 16 high), neither word line WLi or WLi+1 can be selected, while if it is selected (node 16 low) either WLi or WLi+1 will be selected, depending on whether AN or $\overline{AN}$ goes high. Only one word line WL will be selected for a given address bit pattern.

TABLE 1

| OR DECODER NODE 16 | AN | $\overline{AN}$ | WLi | WLi + 1 | CONDITION |
|---|---|---|---|---|---|
| Low | Low | Low | Low | Low | Precharge |
| Low | Low | High | Low | High | Select WLi + 1 |
| Low | High | Low | High | Low | Select WLi |
| High | Low | High | Low | Low | Deselected |
| High | High | Low | Low | Low | Deselected |

Towards the end of the cycle, the clock signal φR goes up and all address line signals A1 through AN as well as $\overline{A1}$ through $\overline{AN}$ go low. The nodes 17 and 18 discharge low, pulling the selected driver output low. At the end of the cycle, reset clock signal φR and precharge clock signal φPC go down as shown in FIGS. 3-7. As a result, node 16 is pulled low, turning off devices 8 and 10, leaving nodes 17 and 18 discharged low, but floating. To avoid charging of the nodes 17 and 18 over a long cycle time, an n-channel pull down device with gate connected to VDD can be connected between the node and ground. This n-channel device should be small compared to transistors 9 and 11 so as not to significantly slow word line selection.

It is necessary to have the internal address bit signal AN/$\overline{AN}$ not arrive too early with respect to the other address bit signals A1 through AN-1. If the address bit signal AN/$\overline{AN}$ arrives too early, it can lead to an erroneous charging to VDD of nodes 17 and 18. For example, if node 16 will charge to VDD when addresses A1 through AN-1 arrive, and if line $\overline{AN}$ goes high before node 16 has charged to VDD, then node 18 can at least partially charge up towards VDD through devices 11 and 20 (FIG. 2) and this can bring the associated word line WLi+1 up in error. This erroneous signal is transient, and the circuit will eventually settle into the correct output condition. On the other hand, it is desirable to have the address signal AN or $\overline{AN}$ arrive as early as possible to minimize delay through the entire circuit. Thus, there is a trade off in the early arrival of address bit AN/$\overline{AN}$ between minimizing the delay through the circuit and not causing an erroneous transient charging. The circuit of this invention can be readily optimized for minimum delay without significant erroneous transient charging and without substantial impact on overall performance.

Prevention of significant erroneous transient charging is provided through two means; by delaying the arrival of the address bit signal AN/$\overline{AN}$ with respect to the other address bit signals A1 through AN-1 and through automatic additional delay of the address bit signal AN/$\overline{AN}$ when the OR decoders are slow in deselecting. The delay of the address bit signal AN/$\overline{AN}$ is provided by adding two pair of CMOS inverters to the outputs of an address buffer of the same type as used for the address bit signals A1 through AN-1 as shown in FIG. 2. Introduction of the delay of the address bit signal AN/$\overline{AN}$ in this way places the same number of n-channel and p-channel transistors in the two circuit paths that control whether or not erroneous transient charging occurs, the path from the clock in FIG. 2 to the output of the OR decoders (node 16) and the path from the clock in FIG. 2 to the address bit signal AN/$\overline{AN}$. Thus, the combination of the circuits in FIGS. 1 and 2 provides an easy means for equalizing the time at which the $2^N-1$ OR decoders deselect (node 16 rises) with the time at which the address bit signal AN/$\overline{AN}$ rises. This provides the minimum delay through the decoder/driver circuit without causing an erroneous transient charging.

Further prevention of significant erroneous transient charging is provided by the interaction of the decoder/driver circuits of FIG. 1 with the address buffers shown in FIG. 2 for the address bit signal AN/$\overline{AN}$. If the address bit signal AN/$\overline{AN}$ arrives too early with respect to the other address bit signals A1 through AN-1, then not all of the $2^N-1$ OR decoders will be deselected and address bit signal AN/$\overline{AN}$ will try to charge node 17 or 18 high in each of the OR decoders that have not yet deselected. This increases the load capacitance on the address line AN or $\overline{AN}$ which will slow down its charging to VDD through transistor 19 or 20 (FIG. 2). Thus, an automatic additional delay of the address bit signal AN/$\overline{AN}$ occurs when the OR decoders are slow in deselecting. The circuits in FIG. 1 and 2 can be readily optimized so that this additional delay provides sufficient time for all of the $2^N-1$ OR decoders to deselect enough to prevent any significant erroneous transient charging even in the case where address bit signal AN/$\overline{AN}$ arrives as early as the same time as the other address bit signals A1 through AN-1.

The circuit has a number of advantageous features. There is only one OR circuit per pair of word lines which helps to minimize the loading on address lines. After the address lines switch, no clocking is required before the selected word line rises resulting in high performance. By applying a rising signal to the source node of a p-channel transistor in the 1 of 2 selection stage, two stages of amplification can be used in the output driver to charge a high capacitance word line to VDD with minimum delay. If a more conventional n-channel NOR/NAND decoder circuit were used, the output driver could have only one, underpowered, slower stage or three stages with greater total delay. The use of source dotting on the address lines AN,$\overline{AN}$ results in less delay in the 1 of 2 selection stage for a given capacitance load on the address lines AN,$\overline{AN}$ as compared to a more conventional n-channel NOR/NAND decoder circuit. There is no dc power consumed, and dynamic charge storage is required only for a short, well-defined portion of the cycle.

It is understood by one skilled in the art that the invention is not limited to the specific embodiment shown. For example, the p-type and n-type devices may be n-type and p-type respectively, with corresponding changes in the polarity of the signals and their complement.

Having thus described our invention, what we claim as new, and desire to secure by Letters Patent is:

1. A decoder/driver circuit means for semiconductor memories of the type including a precharge clock, a reset clock and address lines comprising an OR circuit means including AN-1 n-type channel devices having gate electrodes respectively connected to AN-1 address lines and responsive to address bit signals A1 through AN-1 and drain electrodes connected in common, an n-type channel device having a gate electrode connected to a reset clock and responsive to a reset clock signal $\phi R$, a p-type channel device having a gate electrode connected to a precharge clock and responsive to a precharge clock signal $\phi PC$, and an output node, a one of two selection circuit means connected to said OR circuit means and to AN and $\overline{AN}$ address lines and responsive to an AN address bit signal and the complement of an AN address bit signal, respectively, thereon, and an output driver stage connected to said selection circuit means, said output driver stage including first and second nodes connected to said selection circuit means, first and second transistor driver circuits connected, respectively, to said first and second nodes, and a first driver output line and a second driver output line connected respectively to said first and second transistor driver circuits, said decoder/driver circuit being responsive to said address bit signals on said A1 through AN address lines for providing an output signal on said first driver output line and said second driver output line in response to said address bit signals.

2. A decoder/driver circuit according to claim 1 wherein said first driver output line is a word line WLi and said second driver output line is a word line WLi+1.

3. A decoder/driver circuit according to claim 2 wherein said transistor device having a gate electrode connected to said precharge clock is a p-channel device having a source electrode connected to a voltage source $V_{DD}$ and a drain electrode connected in common with the drain electrodes of said AN-1 transistor devices, and wherein said AN-1 transistor devices are n-channel devices, and wherein said transistor device having a gate electrode connected to said reset clock is a n-channel device having a drain electrode connected in common with said drain electrodes of said AN-1 transistor devices.

4. A decoder/driver circuit according to claim 3 wherein said OR circuit means further includes a pair of transistor devices consisting of a p-channel device and an n-channel device, said p-channel device having a source electrode connected to said voltage source $V_{DD}$ and a drain electrode connected to the drain electrode of said n-channel device and to said OR circuit means output node, said pair of transistor devices having gate electrodes connected in common with said drain electrodes of said AN-1 transistor devices.

5. A decoder/driver circuit according to claim 4 wherein said one of two selection circuit means includes two pairs of transistors, each pair including a p-channel device and an n-channel device, the source electrode of the p-channel device of one of said pairs being connected to said AN address bit line and the source electrode of said p-channel device of said other one of said pairs being connected to said $\overline{AN}$ address line, the gate electrode of said p and n-channel devices of said two pairs of transistors being connected in common with said output node of said OR circuit means, and the drain electrodes of said p-channel device and the drain electrode of said n-channel device of one of said two transistor pairs being connected in common to said first node of said output driver stage, and the drain electrode of said n-channel device and the drain electrode of said n-channel device of the other one of said two transistor pairs being connected in common to said second node of said output driver stage.

6. A decoder/driver stage according to claim 5 wherein said output driver stage includes a first two pairs of transistors connected between said first node and said WLi output lead and a second two pairs of transistors connected between said second node and said WLi+1 output lead, said first and second two pairs of transistors each including a p-channel device having a source electrode connected to voltage source $V_{DD}$ and a drain electrode connected to the drain of an n-channel device.

7. A decoder/driver circuit according to claim 6 wherein the address signal and their complements on lines A1-AN-1 are in a low signal state, and wherein the address bit on line $\overline{AN}$ goes to a high state thereby applying voltage $V_{DD}$ to said second node of said output driver stage to select and provide a signal on said WLi+1 output line.

8. A decoder/driver circuit according to claim 6 wherein the address signals and their complements on lines A1-AN-1 are in a low signal state, and wherein the address bit on line AN goes to a high state thereby applying voltage $V_{DD}$ to said first node of said output driver stage to select and provide a signal on said WLi output line.

9. A decoder/driver circuit for a semiconductor memory comprising:

an OR decoder means connected to true and complement lines of a plurality of A1 to AN-1 memory address bits for receiving said memory address bit signals thereon, said OR decoder means further including a first output node means having a low signal condition thereon when all said plurality of designated address bit signals A1 to AN-1 coupled thereto are at a low signal condition and having a high signal condition thereon when any of said plurality of designated address bit signals A1 to AN-1 have a high signal condition, an output word line driver means coupled to a first memory word line and a second memory word line, a selection means coupled to said first output node means of said OR decoder means and the input of said output word line driver means, said selection means being also coupled to the true and complement lines of an AN memory address bit signal, said selection means being responsive to a low signal condition on said OR decoder first output node means and a high signal condition on said true line of said AN address bit signal for producing a high signal condition on said first memory word line and a low signal condition on said second memory word line, said selection means being also responsive to a low signal condition on said OR decoder first output node means and a high signal condition on said complement line of said AN address bit signal for producing a high signal condition on said second memory word line and a low signal condition on said first memory word line, wherein said selection means includes two pairs of transistors, each pair including a p-channel device and an n-channel device, the source electrode of the p-channel device of a first one of said pairs being connected to said AN address bit line and the source electrode of said p-channel device of said other one of said pairs being connected to said $\overline{AN}$ address line, the gate electrode of said p and n-channel devices of said two pairs of transistors being connected in common with said first output node means of said OR decoder means, and the drain electrodes of said p-channel device and the drain electrode of said n-channel device of one of said two transistor pairs being connected in common to one of two inputs of said output word line driver means, and the drain electrode of said p-channel device and the drain electrode of said n-channel device of the other one of said two transistor pairs being connected in common to the other of said two inputs of said output word line driver means, wherein a high signal condition on said AN address bit line coupled to said first transistor pair and a low signal condition on said OR decoder first output node means produces a high signal condition on said first word line, and wherein a high signal condition on said complement line connected to said second transistor pair and a low signal condition on said OR decoder first output node means produces a high signal condition on said second word line.

10. A decoder/driver circuit according to claim 9 wherein said OR decoder means includes a plurality of switching transistors coupled to said true and complement lines of said plurality of A1 to AN-1 memory address bits and wherein a high signal condition on any of the lines connected to said OR decoder produces a charge of said OR decoder first output node means and switches off said selection means, resulting in said first and second word lines remaining low.

11. A decoder/driver circuit according to claim 10 wherein said OR decoder means further includes a precharge transistor device coupled between a potential voltage supply source and said OR decoder first output node means, and which switches off in response to a precharge clock signal $\phi PC$ applied to the gate thereof.

12. A decoder/driver circuit according to claim 11 wherein said OR decoder means further includes a reset transistor device coupled to said decoder output first node means and responsive to a reset signal $\phi R$ applied to the gate thereof for discharging said OR decoder first output node means.

* * * * *